United States Patent
Ashley et al.

(10) Patent No.: US 7,137,056 B2
(45) Date of Patent: Nov. 14, 2006

(54) LOW ERROR PROPAGATION RATE 32/34 TRELLIS CODE

(75) Inventors: Jonathan Ashley, Los Gatos, CA (US); William G. Bliss, Thornton, CO (US); Razmik Karabed, San Jose, CA (US); Kaichi Zhang, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 591 days.

(21) Appl. No.: 10/253,903

(22) Filed: Sep. 25, 2002

(65) Prior Publication Data
US 2004/0059993 A1    Mar. 25, 2004

(51) Int. Cl.
*H03M 13/00* (2006.01)

(52) U.S. Cl. ............ 714/758; 714/800

(58) Field of Classification Search ............ 714/761, 714/802, 803, 801, 758, 800
See application file for complete search history.

(56) References Cited

U.S. PATENT DOCUMENTS

| | | | | |
|---|---|---|---|---|
| 4,486,739 A | * | 12/1984 | Franaszek et al. | 341/59 |
| 4,618,955 A | * | 10/1986 | Sharpe et al. | 714/761 |
| 6,456,208 B1 | * | 9/2002 | Nazari et al. | 341/59 |
| 6,753,797 B1 | * | 6/2004 | Bliss et al. | 341/59 |
| 6,920,604 B1 | * | 7/2005 | Coakeley et al. | 714/802 |

* cited by examiner

*Primary Examiner*—Guy Lamarre
*Assistant Examiner*—Mujtaba K. Chaudry
(74) *Attorney, Agent, or Firm*—Staas & Halsey LLP

(57) ABSTRACT

The present invention relates to a coding system characterized by various combinations of the following properties: 1) Even parity at the output of d of the precoder; 2) A coding rate of 32/34; 3) At least 9 ones per codeword; 4) No more than 13 consecutive zeros in the stream of encoded data (G=13); 5) No more than 13 consecutive zeros in any run of every-other-bit in the stream of codewords (I=13); 6) For closed error events in y or y' having squared-distance $\leq (1$ to $1.5) \times d_{mfb}^2$ in the detector, the decoder produces at most 4 corresponding erroneous data bytes; 7) Decoding of a 34 bit codeword may begin when 19 of its bits have been received; 8) If the Viterbi detector 108 outputs Non-Return to Zero (NRZ) symbols, then its output is filtered by $(1 \oplus D^2)$ before being decoded, but if the Viterbi detector outputs NRZ Inverter (NRZI) symbols, then its output is decoded directly; and 9) The even parity is on NRZ symbols.

34 Claims, 10 Drawing Sheets

MAP FL

FL maps 16 bits, $x=(x_1 \ldots x_{16})$, to 17 bits, $(y_1 \ldots y_{16}\ z)$, as follows:

180

| | if x is in | y1<br>x1 | y2<br>x2 | y3<br>x3 | y4<br>x4 | y5<br>x5 | y6<br>x6 | y7<br>x7 | y8<br>x8 | y9<br>x9 | y10<br>x10 | y11<br>x11 | y12<br>x12 | y13<br>x13 | y14<br>x14 | y15<br>x15 | y16<br>x16 | z |
|---|---|---|---|---|---|---|---|---|---|---|---|---|---|---|---|---|---|---|
| 1 | G | x1 | x2 | x3 | x4 | x5 | x6 | x7 | x8 | x9 | x10 | x11 | x12 | x13 | x14 | x15 | x16 | 1 |
| 2 | R01 | x9 | x10 | x11 | x12 | x13 | x14 | x15 | x16 | 0 | 1 | g1 | g2 | g3 | g4 | 0 | 0 | 0 |
| 3 | R02 | x1 | x2 | x3 | x4 | x5 | x6 | x7 | x8 | 1 | 0 | h1 | h2 | h3 | h4 | 0 | 0 | 0 |
| 4 | R03 | g1 | g2 | g3 | g4 | h1 | h2 | h3 | h4 | 0 | 0 | 0 | 1 | 1 | 1 | 0 | 0 | 0 |
| 5 | R1 | x1 | x2 | x3 | 1 | x5 | x9 | x7 | x11 | 1 | 1 | 1 | x15 | x13 | x16 | 0 | 0 | 0 |
| 6 | R2 | x1 | x2 | x3 | x4 | x10 | x6 | x15 | x8 | 0 | 1 | 0 | x12 | x16 | x14 | 0 | 0 | 0 |
| 7 | R3 | x1 | x2 | x3 | x4 | x5 | 1 | 1 | 1 | 1 | 0 | 1 | x15 | x16 | x14 | 0 | 0 | 0 |

Where [g1 g2 g3 g4] and [h1 h2 h3 h4] are generated as follows.

MAP FR

FR maps 16 bits, x=(x1---x16), to 17 bits, (y1---y16 z), as follows:

200

| | if x is in | y1 | y2 | y3 | y4 | y5 | y6 | y7 | y8 | y9 | y10 | y11 | y12 | y13 | y14 | y15 | y16 | z |
|---|---|---|---|---|---|---|---|---|---|---|---|---|---|---|---|---|---|---|
| 1 | G | x1 | x2 | x3 | x4 | x5 | x6 | x7 | x8 | x9 | x10 | x11 | x12 | x13 | x14 | x15 | x16 | 1 |
| 2 | R01 | 0 | 0 | g1 | g2 | g3 | g4 | 0 | 1 | x9 | x10 | x11 | x12 | x13 | x14 | x15 | x16 | 0 |
| 3 | R02 | 0 | 0 | h1 | h2 | h3 | h4 | 1 | 0 | x1 | x2 | x3 | x4 | x5 | x6 | x7 | x8 | 0 |
| 4 | R03 | 0 | 0 | 0 | 1 | 1 | 1 | 0 | 0 | g1 | g2 | g3 | g4 | h1 | h2 | h3 | h4 | 0 |
| 5 | R1 | 0 | 0 | x3 | x1 | x5 | x2 | 1 | 1 | x9 | x7 | x11 | 1 | x13 | 1 | x15 | x16 | 0 |
| 6 | R2 | 0 | 0 | x1 | x4 | x2 | x6 | 1 | 1 | x8 | x10 | x12 | 0 | x14 | 1 | x15 | x16 | 0 |
| 7 | R3 | 0 | 0 | 1 | x4 | x5 | 1 | 0 | 0 | x1 | x2 | x3 | 1 | 1 | x14 | x15 | x16 | 0 |

Where [g1 g2 g3 g4] and [h1 h2 h3 h4] are generated as follows.

ENCODER

The Encoder maps d(1,1) d(1,2) ... d(1,16)), (d(2,1) d(2,2) ... d(2,16)) ===> (c(1,1) ... c(1,16) q c(2,1) ... c(2,16) p)

according to:

210

| | c(1,1) | c(1,2) | c(1,3)-c(1,14) | c(1,15) | c(1,16) | q | c(2,1) | c(2,2) | c(2,3)-c(2,14) | c(2,15) | c(2,16) | p |
|---|---|---|---|---|---|---|---|---|---|---|---|---|
| e1=1 & e2=1 | a1 | a2 | a3-a14 | a15 | a16 | 1 | b1 | b2 | b3-b14 | b15 | b16 | |
| e1=0 & e2=1 | a1 | a2 | a3-a14 | 0 | b2 | 0 | b1 | 1 | b3-b14 | b15 | b16 | |
| e1=1 & e2=0 | a1 | a2 | a3-a14 | 1 | a16 | 0 | a15 | 0 | b3-b14 | b15 | b16 | |
| e1=0 & e2=0 | a1 | a2 | a3-a14 | 1 | 1 | 0 | 1 | 1 | b3-b14 | b15 | b16 | | where p = c(2+16) + c(2,13) + c(2,12) + c(2,9) + c(2,8) + c(2,5) + c(2,4) + c(2,1) + q + c(1,14) + c(1,13) + c(1,10) + c(1,9) + c(1,6) + c(1,5) + c(1,2) + c(1,1) + state1 + state2 (mod 2)

and where
The pre-coder is in state, $S_{initial} = (state_1\ state_2)$, when it receives c(1,1).
All 32 data bits are not needed to start encoding; encoding may start after 16 data bits.

Figure 5

MAP FL$^{-1}$

FL$^{-1}$ maps 17 bits, (y1 ... y16 z), to 16 bits, x=(x1 ... x16), as follows:

220

| | x1 | x2 | x3 | x4 | x5 | x6 | x7 | x8 | x9 | x10 | x11 | x12 | x13 | x14 | x15 | x16 |
|---|---|---|---|---|---|---|---|---|---|---|---|---|---|---|---|---|
| 1 | z=1 | y1 | y2 | y3 | y4 | y5 | y6 | y7 | y8 | y9 | y10 | y11 | y12 | y13 | y14 | y15 | y16 |
| 2 | z=0 & y9y10=01 | t1 | t2 | t3 | t4 | t5 | t6 | t7 | t8 | y1 | y2 | y3 | y4 | y5 | y6 | y7 | y8 |
| 3 | z=0 & y9y10=10 | y1 | y2 | y3 | y4 | y5 | y6 | y7 | y8 | t9 | t10 | t11 | t12 | t13 | t14 | t15 | t16 |
| 4 | z=0 & y9y10y11=000 | w1 | w2 | w3 | w4 | w5 | w6 | w7 | w8 | w9 | w10 | w11 | w12 | w13 | w14 | w15 | w16 |
| 5 | z=0 & y9y10y11=111 | y1 | y2 | y3 | 0 | y5 | 0 | y7 | 0 | y6 | 0 | y8 | 0 | y13 | 0 | y12 | y14 |
| 6 | z=0 & y9y10y11=110 | y1 | y2 | 0 | y4 | 0 | y6 | 0 | y8 | 0 | y5 | 0 | y12 | 0 | y14 | y12 | y14 |
| 7 | z=0 & y9y10y11=001 | y1 | y2 | y3 | y4 | y5 | y6 | 0 | 0 | 0 | 0 | 0 | 0 | 0 | y14 | y7 | y13 | where (t1 t2 ... t8), (t9 t10 ... t16), (w1 w2 ... w8) and (w9 w10 ... w16) are generated below.

MAP FR⁻¹

FR$^{-1}$ maps 17 bits, (y1---y16 z), to 16 bits, x=(x1---x16), as follows:

230

| # | condition | x1 | x2 | x3 | x4 | x5 | x6 | x7 | x8 | x9 | x10 | x11 | x12 | x13 | x14 | x15 | x16 |
|---|---|---|---|---|---|---|---|---|---|---|---|---|---|---|---|---|---|
| 1 | z=1 | y1 | y2 | y3 | y4 | y5 | y6 | y7 | y8 | y9 | y10 | y11 | y12 | y13 | y14 | y15 | y16 |
| 2 | z=0 & y7y8=01 | t1 | t2 | t3 | t4 | t5 | t6 | t7 | t8 | t9 | t10 | t11 | t12 | t13 | t14 | t15 | t16 |
| 3 | z=0 & y7y8=10 | y9 | y10 | y11 | y12 | y13 | y14 | y15 | y16 | t9 | t10 | t11 | t12 | t13 | t14 | t15 | t16 |
| 4 | z=0 & y3y7y8=000 | w1 | w2 | w3 | w4 | w5 | w6 | w7 | w8 | w9 | w10 | w11 | w12 | w13 | w14 | w15 | w16 |
| 5 | z=0 & y7y8y12=111 | y4 | y6 | y3 | 0 | y5 | 0 | y10 | 0 | y9 | 0 | y11 | 0 | y13 | 0 | y15 | 0 |
| 6 | z=0 & y7y8y12=110 | y3 | y6 | y3 | y4 | y5 | y6 | 0 | y9 | 0 | y10 | y11 | y12 | y13 | y14 | y15 | y16 |
| 7 | z=0 & y3y7y8=100 | y9 | y10 | y11 | y4 | y5 | y6 | 0 | 0 | 0 | 0 | 0 | 0 | 0 | y14 | y15 | y16 |

Where (t1 t2 ... t8), (t9 t10 ... t16), (w1 w2 ... w8) and (w9 w10 ... w16) are generated below.

DECODER

The decoder performs (c(1,1) c(1,2) ... c(1,16) q c(2,1) c(2,2) ... c(2,16) p) ===> (d(1,1) d(1,2) ... d(1,16) d(2,1) d(2,3) ... d(2,16)), as given in table below.

240

| | d(1,1) d(1,2) ... d(1,16) | d(2,1) d(2,3) ... d(2,16) |
|---|---|---|
| q=1 | FL⁻¹ (c(1,1),c(1,2),c(1,3),...,c(1,14),c(1,15),c(1,16),1) | FR⁻¹ (c(2,1), c(2,2), c(2,3),...,c(2,14),c(2,15),c(2,16),1) |
| q=0 & c(1,15)=0 | FL⁻¹ (c(1,1),c(1,2),c(1,3),...,c(1,14),0 , 0 ) | FR⁻¹ (c(2,1),c(1,16),c(2,3),...,c(2,14),c(2,15),c(2,16),1) |
| q=0 & c(1,15)=1 & c(2,2)=0 | FL⁻¹ (c(1,1),c(1,2),c(1,3),...,c(1,14),c(2,1),c(1,16),1) | FR⁻¹ (0, 0, c(2,3),...,c(2,14),c(2,15),c(2,16),0) |
| q=0 & c(1,15)=1 & c(2,2)=1 | FL⁻¹ (c(1,1),c(1,2),c(1,3),...,c(1,14),0 , 0 ) | FR⁻¹ (0, 0, c(2,3),...,c(2,14),c(2,15),c(2,16),0) |

Figure 8

LOW ERROR PROPAGATION RATE 32/34 TRELLIS CODE

REFERENCE TO COMPUTER PROGRAM LISTING, COMPACT DISC APPENDIX

A compact disc is included herewith and incorporated by reference herein having thereon a computer program listing appendix in the ASCII uncompressed text format with ASCII carriage return, ASCII line feed and all control codes defined in ASCII, having computer compatibility with IBM PC/XT/AT or compatibles, having operating system compatibility with MS-Windows and including file source_code_3234.txt of 22,800 bytes, created on Sep. 23, 2002.

BACKGROUND OF THE INVENTION

1. Field of the Invention

The present invention is directed to a coding system for encoding or decoding data while minimizing propagation of any errors introduced after the encoding and before the decoding and while assuring certain properties of words encoded by the coding system.

2. Description of the Related Art

To minimize errors introduced during the transfer or transmission of data, and to assure certain properties of the data when in a form for conveyance, systems often encode data before it is conveyed between two points. Encoding typically involves transforming the data and introducing additional information to the data, where the additional information can be used during decoding to recover from or minimize the effect of discrepancies introduced by filtering, conveying, or otherwise manipulating the data after it has been encoded.

A coding scheme (or code) may be measured by two opposing qualities. A first quality of a coding scheme is the efficiency or rate of the code, which is the amount of input data to be encoded, in proportion to the amount of the input data plus added coding information. For example, if a code adds two coding bits to a 32-bit input word, thus producing a 34-bit codeword, then the rate of the code is 32/34. A low coding rate naturally leads to an efficient rate of conveying the input data, because less total information must be conveyed per unit of input data that is conveyed. A second quality of a coding scheme is the degree to which the added coding information facilitates recovery from or minimization of errors introduced during conveyance. There is a tension between these two coding qualities. Higher error recovery rates (desirable) generally require less efficient coding rates (undesirable). More efficient coding rates (desirable) generally lead to lower error recovery rates (undesirable). What is needed is a coding scheme with a high error recovery rate and an efficient coding rate.

SUMMARY OF THE INVENTION

It is an aspect of the present invention to provide a coding system that exhibits various combinations of the following properties:

(1) Even parity at the input to a channel (i.e. even parity at the output of the pre-coder);
(2) A coding rate of 32/34;
(3) At least 9 ones per codeword;
(4) No more than 13 consecutive zeros in the stream of encoded data (G=13);
(5) No more than 13 consecutive zeros in any run of every-other-bit in the stream of encoded data (I=13);
(6) For closed error events having squared distance $\leq 1.5 \times d_{mfb}^2$, where $d_{mfb}^2$ is the squared-distance of the matched filter bound, no more than 4 decoded data bytes are in error, including closed error events that cross codeword boundaries;
(7) Decoding of a 34 bit codeword may begin when 19 of its bits have been received;
(8) If the Viterbi detector (predecoder) outputs Non-Return to Zero (NRZ) symbols, then its output is filtered by $(1 \oplus D^2)$ before being decoded, but if the Viterbi detector outputs NRZ Inverter (NRZI) symbols, then its output is decoded directly; and
(9) The even parity is on NRZ symbols.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 3 shows a table 180 describing independently the map FL in terms of mapping a vector (x1 ... x16) to a vector (y1 ... y16 z).

FIG. 4 shows a table 200 describing the map FR independently in terms of mapping a (x1 ... x16) to a vector (y1 ... y16 z).

FIG. 5 shows a table 210 that describes a mapping using the maps FL and FR, in terms of input vector d and output vector c.

FIG. 6A shows a table 220 describing the map $FL^{-1}$. FIGS. 6A–6B show further details of the map $FL^{-1}$.

FIG. 7A shows a table 230 describing the map $FR^{-1}$. FIGS. 7A–7B show further details of the map $FR^{-1}$.

FIG. 8 shows a table 240 describing the mapping of the decoder 114.

DETAILED DESCRIPTION OF THE PREFERRED EMBODIMENTS

Overview of System Using 32/34 Code

Figure 1:
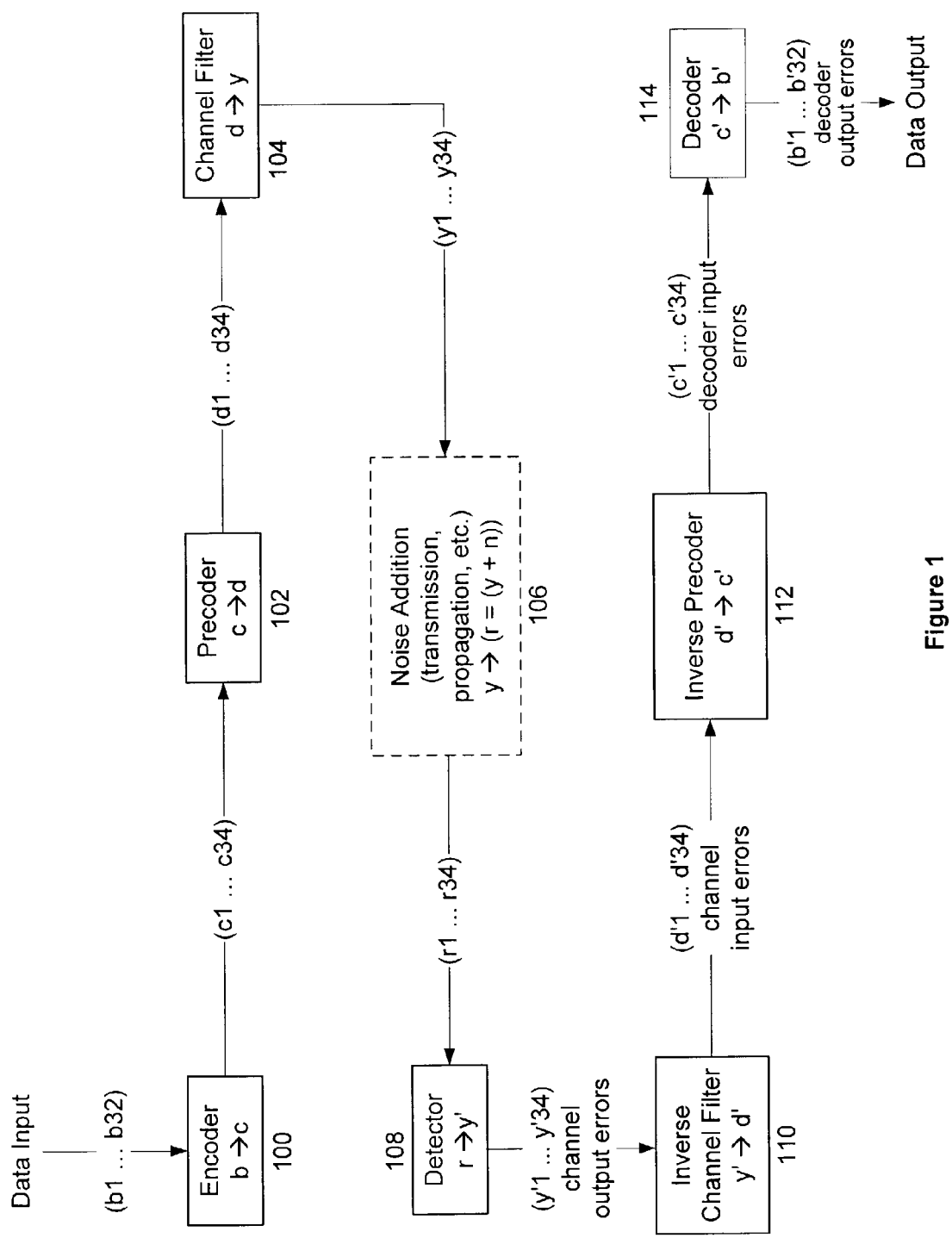
FIG. 1 shows a system for using the 32/34 code of the present invention.

FIG. 1 shows a system for using the 32/34 code of the present invention. The pre-conveying half of the system in FIG. 1 may be summarized as: b→c→d→y, where b is encoded to c, c is precoded to d, and d is filtered to y. An encoder 100 receives 32 bits of input data (b1 ... b32), where (b1 ... b32) denotes a vector or word of 32 bits. The encoder 100 encodes the input data, and outputs 34 bits of encoded data (c1 ... c34). A precoder 102 receives the encoded output (c1 ... c34) of the encoder 100, and performs an exclusive-or (XOR) state transformation on the sequence (c1 ... 34) to produce an output sequence (d1 ... d34). A channel filter 104 receives the sequence (d1 ... d34), performs another state transformation based on the sequence (d1 ... d34), and outputs resulting sequence (y1 ... y34).

The data y is then subjected to potential noise at a conveyance stage 106. The conveyance stage 106 may randomly perturb the symbols in sequence (y1 ... y34), thus producing sequence (r1 ... r34). For each symbol y(i) in word (y1 ... y34), there is some probability (usually random) that the conveyance stage 106 will perturb y(i) with noise error n(i). The result of the conveyance received by detector 108 can be denoted as vector addition (y1 . . . y34)+(n1 . . . n34)=(r1 . . . r34), or symbol addition r(i)=y(i)+r(i). The sequence (r1 . . . r34) is often called the received sequence.

The post-conveying half of the system in FIG. 1 may be summarized as: $r \to y' \to d' \to c' \to b'$, where r is Viterbi-detected to y', y' is filtered to d', d' is inverse-precoded to c', and c' is decoded to b'.

The detector 108, generally a Viterbi detector, receives the possibly perturbed sequence (r1 . . . r34) and produces (y'1 . . . y'34), which is a reconstruction of (y1 . . . y34) with possibly one or more bits in error or perturbed. When any symbol y'(i) is in error, i.e. when y'(i) ≠ y(i), a channel output error event has occurred. Channel output error events are typically attributable to noise n.

An inverse channel filter 110 receives y' and transforms (y'1 . . . y'34) to (d'1 . . . d'34). An inverse-precoder 112 receives d' and transforms (d'1 . . . d'34) to (c'1 . . . c'34) by performing the inverse of the precoder 102. When a bit of d', say d'(j) differs from its corresponding original bit d(j), a channel input error event is said to have occurred. Generally, there is a one-to-one correspondence between channel input error events and channel output error events. In other words, a channel input error event filtered by the channel filter leads to a corresponding channel output error event. Furthermore, both channel input error events and channel output error events can cross codeword boundaries.

The decoder 114 receives (c'1 . . . c'34), applies an inverse of the coder 100, and outputs a reproduction (b'1 . . . b'32) of the input data (b1 . . . b32), where some reproduced or decoded bits in b' may be in error. That is to say, for some original bits b(i) and corresponding reproduced bits b'(i), it is possible that b'(i)≠b(i). Errors in the reproduced data b' are generally propagations of one or more errors received in c' and are referred to hereafter as decoder output errors.

Although shown as separate units, the functionality of the detector 108, the inverse channel filter 110, and the inverse-precoder 112 may have various arrangements. For example, the Viterbi detector 108 may be constructed to include the functionality of the channel filter 110, the inverse-precoder 112, or both.

Discussion of Error Events

An aspect of the present invention is that typical errors going into the decoder result in short errors being outputted by the decoder. With most decoders, an error received by the decoder is propagated to the output of the decoder. The error propagation of a decoder can be understood in terms of the number of output bytes that are in error due to a typical or expected input error. With the present decoder, typical short decoder input errors result in short decoder output errors. That is to say, the 32/34 code of the present invention guarantees that small decoder input errors (or input errors within a certain range) result in decoder output errors of no more than 4 bytes, even in the case where an input error crosses a boundary between two codewords. There are some typical error events cross codeword boundaries, in which case it is desirable that both codewords are not entirely corrupted. Typical cross-boundary errors are required to propagate to no more than 4 bytes between the two relevant codewords.

Generally, as discussed in detail below, errors received and propagated by the decoder are no more than 4 data bytes for all closed error events having squared-distance $\leq 1.5 \times d_{mfb}^2$, where $d_{mfb}^2$ is the squared-distance of the matched filter bound (property 6 in the SUMMARY). This property is discussed in detail later.

Figure 2:
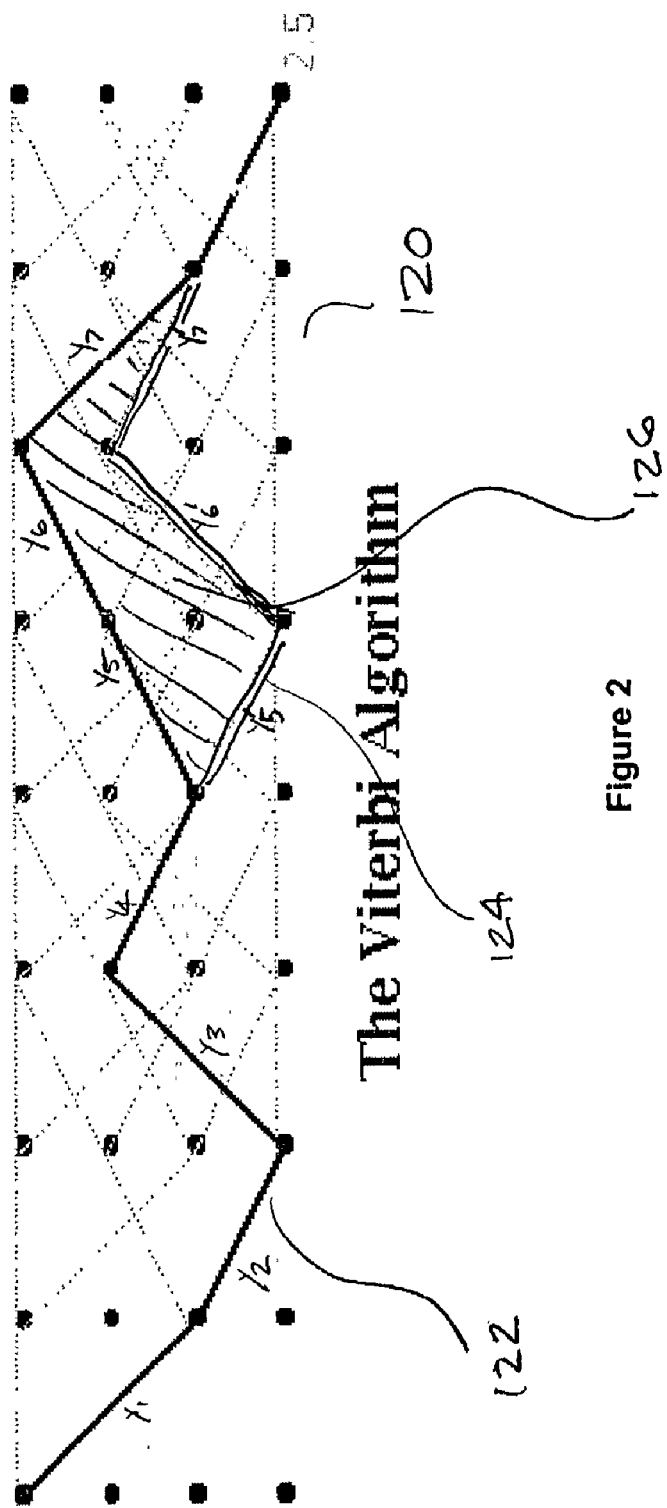
FIG. 2 shows an example of a trellis 120 of a Viterbi detector.

FIG. 2 shows an example of a trellis 120 of a Viterbi detector. The trellis 120 shown in FIG. 2 is referred to only for discussion and its particular construction is not used with the present coding system. Path 122 represents an original or true path 122. Path 124 represents a detected path 124 corresponding to original path 122, but where some of y' bits deviate from their original path 122. The area 126 is a closed error event, sometimes called a diamond. A closed error event or diamond is a sequence of trellis transitions where the actual transitions through the trellis diverge from the original transitions, and after some transitions the actual transition path returns to the true original transition path. The squared-distance of an error event or diamond is $$\sum_{i=p}^{q} (y_i - y'_i)^2,$$

where p and q are the bounds of an error event. An error event can span multiple codewords or may be limited to one codeword. For example, for two consecutive words $y_1=(y_{1,1}\ y_{1,2} \ldots y_{1,34})$ and $y_2=(y_{2,1}\ y_{2,2} \ldots y_{2,34})$, if p=1,34 and q=2,2, then the squared-distance of the error event is $(y_{1,34}-y'_{1,34})^2 + (y_{2,1}-y'_{2,1})^2 + (y_{2,2}-y'_{2,2})^2$.

A trellis is a deterministic state machine, and possible error events or diamonds on a trellis can be predicted in advance. Given a set of likely closed error events for the filter, $d_{mfb}^2$ can be used to define a maximum squared-distance that will result from one of those closed error events. For filter [3 2-2-2-1], $d_{mfb}^2=22$, for filter [3 1-2-1-1], $d_{mfb}^2=16$. Furthermore, a minimum distance over all error events coming from a trellis is $d_{min}^2$, which is generally the same as $d_{mfb}^2$, but may be less for some filters. For example, the filter [3 2-2-2-1], $d_{mfb}^2=22$, however $d_{min}^2=18$. Error events with distance-squared close to $d_{min}^2$ are most likely to occur.

With the present invention, a list or set of probable error events was compiled. Property (6), mentioned above in the SUMMARY, was established by decoding probable error events with the decoder of the present invention. No probable or likely error events were propagated to more than 4 decoded bytes. One potential error event set was defined to include all closed error events having a squared-distance $<=1.5 \times d_{mfb}^2$. When decoded, these error events propagate to no more than 4 bytes. That is to say, only 4 decoded bytes will differ from their corresponding original bytes due to decoding the corresponding closed error event. Other properties of the present code are a natural result of its design and mappings.

The Encoder

The encoder 100 maps 32-bit input words to 34-bit codewords. The encoder maps input words to codewords using two maps; FL and FR. One half (16 bits) of each input word is mapped using the FL map, and the other half (16 bits) is mapped using the FR map. FIG. 3 shows a table 180 describing independently the map FL in terms of mapping a vector (x1 . . . x16) to a vector (y1 . . . y16 z). FIG. 4 shows a table 200 describing the map FR independently in terms of mapping a (x1 . . . x16) to a vector (y1 . . . y16 z).

The mapping of the encoder 100 is described below, independent of the system shown in FIG. 1, in terms of mapping a vector (d(1,1) d(1,2) ... d(1,16)) (d(2,1) d(2,3) ... d(2,16)) to a vector (c(1,1) c(1,2) ... c(1,16) q c(2,1) c(2,2) ... c(2,16) p). In the context of FIG. 1, the encoder 100 receives b and outputs c, where, (d(1,1) d(1,2) ... d(1,16) d(2,1) d(2,3) ... d(2,16))=b, and (c(1,1) c(1,2) ... c(1,16)) q (c(2,1) c(2,2) ... c(2,16) p)=c.

The following partitioning of the domain of input vector x is used for both the FL and FR maps (note, "~", "&", and "|" denote bitwise complement, AND, and OR, respectively).

Let:

x be the set of all possible 16-bit vectors, where x=(x1 x2 x3 x4 x5 x6 x7 x8 x9 x10 x11 x12 x13 x14 x15 x16)

Define subsets of x:

B01={x: x1+x2+x3+x4+x5+x6+x7+x8<2& x9+x10+x11+x12+x13+x14+x15+x16>1}

B02={x: x1+x2+x3+x4+x5+x6+x7+x8>1& x9+x10+x11+x12+x13+x14+x15+x16<2}

B03={x: x1+x2+x3+x4+x5+x6+x7+x8<2& x9+x10+x11+x12+x13+x14+x15+x16<2}

B1={x: x4=x6=x8=x10=x12=x14=0}
B2={x: x3=x5=x7=x9=x11=x13=0}
B3={x: x6=x7=x8=x9=x10=x11=x12=x13=0}
B=B01∪B02∪B03∪B1∪B2∪B3
G=~B
R01=B01
R02=B02
R03=B03
R1=(~B01)∩(~B02)∩(~B03)∩B1
R2=(~B01)∩(~B02)∩(~B03)∩(~B1)∩B2
R3=(~B01)∩(~B02)∩(~B03)∩(~B1)∩(B2)∩B3

The sets R01, R02, R03, R1, R2 and R3, are pair-wise disjoint.

The tables 180 and 200 describe how the maps FL and FR map a 16 bit vector x=(x1 ... x16) to 17 a bit vector (y1 ... y16 z). Because the subsets or partitions of x (rows G, R01, R02, R03, R1, R2, R3) are pair-wise disjoint, x can be in only one of the partitions, and x can be mapped to only one of rows 1–7. For example, if x is (0 0 0 0 0 0 0 1 0 0 0 0 0 0 0 1), then x is a member of subset R03; because x1+x2+x3+x4+x5+x6+x7+x8=1, (which is less than 2), and x9+x10+x11+x12+x13+x14+x15+x16=1 (also less than 2), x is in subset B03, and R03=B03, so x is only in partition R03. The vectors to which the exemplary x is mapped are defined according to rows 4 of the tables 180, 200. The map FL will map x to the 17-bit vector (g1 g2 g3 g4 h1 h2 h3 h4 0 0 0 1 1 1 0 0 0), and the map FR will map x to the 17-bit vector (0 0 0 1 1 1 0 0 g1 g2 g3 g4 h1 h2 h3 h4 0).

FIG. 5 shows a table 210 that describes a mapping using the maps FL and FR, in terms of input vector d and output vector c. The maps FL and FR are used together to define the mapping of the encoder 100. If codeword (d(1,1) d(1,2) ... d(1,16)), (d(2,1) d(2,2) ... d(2,16)) is to be encoded, then FL is used to map (d(1,1) ... d(1,16)) to (a1 ... a16 e1), and FR is used to map (d(2,1) d(2,2) ... d(2,16)) to (b1 b2 ... b16 e2). The row of table 210 that will be used for any given d will depend on the values of the e1 and e2 bits generated by FL and FR, respectively. Using the example vector x from above, if d is the 34-bit vector (x x), then e1=0, and e2=0, and the fourth row of table 210 would be used to map vector (x x) to vector c.

The Precoder

The precoder 102 is a finite state machine. Assuming an input of c, an output of d, and time n, then the states of the precoder 102 are:

| | |
|---|---|
| initial state: | state$_{initial}$=(state$_1$ state$_2$) |
| output state: | d = c + state$_2$ (mod 2) |
| finial state: | s$_{final}$ = (d state$_1$). |

More specifically, the precoder 102 receives (c1 ... c34), and generates (d1 ... d34) by setting d(i)=c(i) XOR d(i−2), where i is >=3, and where d(1) and d(2) may have any initial values. For example d(1)=c(1) XOR state$_2$, d(2)=c(2) XOR state$_1$. The designer chooses the initial state, and that information is used at the precoder to generate the first two outputs.

Often it is desired that the output of the pre-coder should have an even number of ones for every 34 bits that span the image of a codeword. If codeword c=(c(1,1) c(1,2) ... c(1,16) q c(2,1) c(2,2) ... c(2,16) p) is input to the pre-coder having initial state s$_{initial}$=(state$_1$ state$_2$), then d$_1$+d$_2$+ ... +d$_{34}$=0 (mod2), where d$_k$ is the output of the pre-coder corresponding to the input x$_k$.

The Channel Filter

The channel filter 104 receives (d1 ... d34). For filter [3 2-2-2-1], the channel filter 104 outputs (y1 ... y34), where y(i)=3d(i)+2d(i−1)−2d(i−2)−2d(i−3)−d(i−4), where any initial state of d will suffice. For filter [3 1-2-1-1], the channel filter is y(i)=3d(i)+d(i−1)−2d(i−2)−d(i−3)−d(i−4). Other filters may also be used.

The Decoder

The decoder 114 maps 34-bit codeword reproductions (c') to 32-bit reproductions of the input words (b'). The decoder maps codeword reproductions (c') to input word reproductions (b') using two maps FL$^{-1}$ and FR$^{-1}$; the inverses of maps FL and FR. The first 16 bits of an input word reproduction (a decoded codeword) are generated using the FL$^{-1}$ map, and the last 16 bits of an input word reproduction (a decoded codeword) are mapped using the FR$^{-1}$ map. The maps FL$^{-1}$ and FR$^{-1}$ are described generically below in terms of mapping an input vector (y1 ... y16 z) to an output vector (x1 ... x16).

The mapping of the decoder 114 is described independently below as mapping input vector (c(1,1) c(1,2) ... c(1,16)) q (c(2,1) c(2,2) ... c(2,16) p) to output vector (d(1,1) d(1,2) ... d(1,16)) (d(2,1) d(2,3) ... d(2,16)). In the context of FIG. 1, the decoder 114 receives c' and outputs b', where (c(1,1) c(1,2) ... c(1,16)) q (c(2,1) c(2,2) ... c(2,16) p)=c', and (d(1,1) d(1,2) ... d(1,16) d(2,1) d(2,3) ... d(2,16))=b'.

FIG. 6A shows a table 220 describing the map FL$^{-1}$. FIGS. 6A–6B show further details of the map FL$^{-1}$. The map FL$^{-1}$ maps 17 bits (y1 ... y16 z) to 16 bits, (x1 ... x16). The mapping of a particular vector will (y1 ... y16 z) depend on the various combinations of bits shown in the second row of table 220. For example, if (y1 ... y16 z)=(y1 ... y9=0 y10=1 ... y16 z=0), then z=0, y9y10=10, and the output (x1 ... x16) is determined based on row 3 of table 220.

FIG. 7A shows a table 230 describing the map FR$^{-1}$. FIGS. 7A–7B show further details of the map FR$^{-1}$. The map FR$^{-1}$ maps 17 bits (y1 ... y16 z) to 16 bits, (x1 ... x16).

The mapping of a particular vector will (y1 ... y16 z) depend on the various combinations of bits found in the second row of table 230. For example, if (y1 ... y16 z)=(y1 ... y7=1 y8=0 ... y16 z=0), then z=0, y7y8=01, and the output (x1 ... x16) is determined based on row 2 of table 230.

FIG. 8 shows a table 240 describing the mapping of the decoder 114. The first 16 bits of the decoded word (d(1,1) d(1,2) ... d(1,16)) are generated using map $FL^{-1}$, and the later 16 bits of the decoded word are generated using map $FR^{-1}$, where the input of the inverse maps is based on the conditions in the first column of table 240. As mentioned above, in the context of FIG. 1, the input c' and output b' of decoder 114 in FIG. 1 respectively correspond to vectors (c(1,1) c(1,2) ... c(1,16) q c(2,1) c(2,2) ... c(2,16) p) and (d(1,1) d(1,2) ... d(1,16) d(2,1) d(2,3) ... d(2,16)) of the description above.

Conclusion

With the coding system discussed above, all closed error events or diamonds with distance-squared <1.5*22 (for filter [3 2-2-2-1]) input to the decoder will not decode to more than 4 bytes in error. An error in y', d', or c' that is within the limit above will not propagate to more than 4 bytes of error. Diamonds are typically within the matched filter bound (mfb) squared-distance, so 1.5*mfb goes beyond the typical diamond, and error events with a squared-distance under 1.5 times $d_{mfb}^2$ will corrupt at most 4 consecutive bytes of output b' of the decoder. If only a few bits in c' are corrupted, perhaps due to corruption in d' or y', the worst the decoder can do is corrupt 4 corresponding bytes of b'.

Furthermore, the present code has various combinations of the following properties:

1. Even parity at the output of d of the precoder 102;
2. A coding rate of 32/34;
3. At least 9 ones per codeword (i.e. codeword c);
4. No more than 13 consecutive zeros in the stream of encoded data c (G=13);
5. No more than 13 consecutive zeros in each interleave of encoded data c (either within or across codeword boundaries), and if two filters are used, the output of the first will be similar to c; if c is 0, the corresponding absolute output is the same) (I=13);
6. For closed error events in c' having squared-distance $\leq (1 \text{ to } 1.5) \times d_{mfb}^2$ in the detector, the decoder produces at most 4 corresponding erroneous data bytes, even for closed error events that cross a boundary between two codewords;
7. Decoding of a 34 bit codeword may begin when 19 of its bits have been received;
8. If the Viterbi detector 108 outputs Non-Return to Zero (NRZ) symbols, then its output is filtered by $(1 \oplus D^2)$ before being decoded, but if the Viterbi detector outputs NRZ Inverter (NRZI) symbols, then its output is decoded directly; and
9. There is even parity on NRZ symbols.

One advantage of property 3 is that a clock can be adjusted using 1's in a codeword. The same property holds if two consecutive filters are used (e.g. $(1-D)^2 \rightarrow a+bD+cD^2$), using non-zero output values of the filters.

The present invention has been described with respect to a coding system exhibiting various combinations of the properties mentioned above. The invention may be used in magnetic storage systems, data transmission systems, and the like, to improve data throughput and to reduce errors. The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An apparatus for encoding, comprising:
   a coding system capable of encoding 32-bit input words into even parity 34-bit codewords, wherein each of the codewords has at least 9 ones, and wherein for any sequence of one or more codewords, any run of zeros within the sequence is limited to at most 13 consecutive zeros.

2. An apparatus according to claim 1, wherein a codeword is capable of starting to be decoded when 19 of its bits have been received.

3. An apparatus for encoding, comprising:
   a coding system capable of encoding 32-bit input words into even parity 34-bit codewords, wherein each of the codewords has at least 9 ones, and wherein the codewords comprise interleaves that can have no more than 13 consecutive zeros.

4. An apparatus according to claim 3, wherein a codeword is capable of starting to be decoded when 19 of its bits have been received.

5. An apparatus for encoding, comprising:
   a coding system capable of encoding 32-bit input words into even parity 34-bit codewords, wherein typical closed error events that are likely to corrupt codewords before they are decoded propagate to 4 or fewer decoded bytes.

6. An apparatus for encoding, comprising:
   a coding system capable of encoding 32-bit input words into even parity 34-bit codewords, wherein typical closed error events that are likely to corrupt codewords before they are decoded propagate to 4 or fewer decoded bytes, and
   wherein the typical closed error events have a squared-distance that is less than 1.5 times a squared-distance of a matched filter bound associated with the coding system.

7. An apparatus according to claim 6, wherein a codeword is capable of starting to be decoded when 19 of its bits have been received.

8. An apparatus according to claim 6, wherein each of the codewords has at least 9 ones.

9. An apparatus according to claim 8, wherein for any sequence of one or more codewords, any run of zeros within the sequence is limited to at most 13 consecutive zeros.

10. An apparatus according to claim 8, wherein for any sequence of one or more codewords, any run of every-other-bit within the sequence is limited to at most 13 consecutive zeros.

11. An apparatus according to claim 8, wherein for any sequence of one or more codewords, any run of zeros within the sequence is limited to at most 13 consecutive zeros, and any run of every-other-bit within the sequence is limited to at most 13 consecutive zeros.

12. A method of encoding, comprising:
   encoding 32-bit input words into even parity 34-bit codewords, wherein each of the codewords has at least 9 ones, and wherein for any sequence of one or more codewords, any run of zeros within the sequence is limited to at most 13 consecutive zeros.

13. A method according to claim 12, wherein a codeword is capable of starting to be decoded when 19 of its bits have been received.

14. A method of encoding, comprising:
encoding 32-bit input words into even parity 34-bit codewords, wherein each of the codewords has at least 9 ones, and wherein the codewords comprise interleaves that can have no more than 13 consecutive zeros.

15. A method according to claim 14, wherein a codeword is capable of starting to be decoded when 19 of its bits have been received.

16. A method of encoding, comprising:
encoding 32-bit input words into even parity 34-bit codewords, wherein typical closed error events that are likely to corrupt codewords before they are decoded propagate to 4 or fewer decoded bytes.

17. A method of encoding, comprising:
encoding 32-bit input words into even parity 34-bit codewords, wherein typical closed error events that are likely to corrupt codewords before they are decoded propagate to 4 or fewer decoded bytes, and
wherein the typical closed error events have a squared-distance that is less than 1.5 times a squared-distance of a matched filter bound associated with the coding system.

18. A method according to claim 17, wherein a codeword is capable of starting to be decoded when 19 of its bits have been received.

19. A method according to claim 17, wherein each of the codewords has at least 9 ones.

20. A method according to claim 19, wherein for any sequence of one or more codewords, any run of zeros within the sequence is limited to at most 13 consecutive zeros.

21. A method according to claim 19, wherein for any sequence of one or more codewords, any run of every-other-bit within the sequence is limited to at most 13 consecutive zeros.

22. A method according to claim 19, wherein for any sequence of one or more codewords, any run of zeros within the sequence is limited to at most 13 consecutive zeros, and any run of every-other-bit within the sequence is limited to at most 13 consecutive zeros.

23. A computer-readable medium storing information for performing a process, the process comprising:
encoding 32-bit input words into even parity 34-bit codewords, wherein each of the codewords has at least 9 ones, and wherein for any sequence of one or more codewords, any run of zeros within the sequence is limited to at most 13 consecutive zeros.

24. A computer-readable medium according to claim 23, wherein a codeword is capable of starting to be decoded when 19 of its bits have been received.

25. A computer-readable medium storing information for performing a process, the process comprising:
encoding 32-bit input words into even parity 34-bit codewords, wherein each of the codewords has at least 9 ones, and wherein the codewords comprise interleaves that can have no more than 13 consecutive zeros.

26. A computer-readable medium according to claim 25, wherein a codeword is capable of starting to be decoded when 19 of its bits have been received.

27. A computer-readable medium storing information for performing a process, the process comprising:
encoding 32-bit input words into even parity 34-bit codewords, wherein typical closed error events that are likely to corrupt codewords before they are decoded propagate to 4 or fewer decoded bytes.

28. A computer-readable medium storing information for performing a process, the process comprising:
encoding 32-bit input words into even parity 34-bit codewords, wherein typical closed error events that are likely to corrupt codewords before they are decoded propagate to 4 or fewer decoded bytes, and
wherein the typical closed error events have a squared-distance that is less than 1.5 times a squared-distance of a matched filter bound associated with the coding system.

29. A computer-readable medium according to claim 28, wherein a codeword is capable of starting to be decoded when 19 of its bits have been received.

30. A computer-readable medium according to claim 28, wherein each of the codewords has at least 9 ones.

31. A computer-readable medium according to claim 30, wherein for any sequence of one or more codewords, any run of zeros within the sequence is limited to at most 13 consecutive zeros.

32. A computer-readable medium according to claim 30, wherein for any sequence of one or more codewords, any run of every-other-bit within the sequence is limited to at most 13 consecutive zeros.

33. A computer-readable medium according to claim 30, wherein for any sequence of one or more codewords, any run of zeros within the sequence is limited to at most 13 consecutive zeros, and any run of every-other-bit within the sequence is limited to at most 13 consecutive zeros.

34. A method of encoding, comprising: encoding 32-bit input words into even parity 34-bit codewords.

* * * * *